United States Patent
Tihanyi et al.

(10) Patent No.: US 6,184,555 B1
(45) Date of Patent: Feb. 6, 2001

(54) FIELD EFFECT-CONTROLLED SEMICONDUCTOR COMPONENT

(75) Inventors: Jeno Tihanyi, Kirchheim; Helmut Strack, München; Heinrich Geiger, Holzkirchen, all of (DE)

(73) Assignee: Siemens Aktiengesellschaft, Munich (DE)

(*) Notice: Under 35 U.S.C. 154(b), the term of this patent shall be extended for 0 days.

(21) Appl. No.: 09/117,636
(22) PCT Filed: Jan. 30, 1997
(86) PCT No.: PCT/DE97/00182
  § 371 Date: Dec. 4, 1998
  § 102(e) Date: Dec. 4, 1998
(87) PCT Pub. No.: WO97/29518
  PCT Pub. Date: Aug. 14, 1997

(30) Foreign Application Priority Data

Feb. 5, 1996 (DE) ............................................. 190 04 043
Feb. 5, 1996 (DE) ............................................. 194 04 044

(51) Int. Cl.[7] .......................... H01L 29/76; H01L 29/94; H01L 31/062
(52) U.S. Cl. .......................... 257/342; 257/329; 257/341
(58) Field of Search .................... 257/328, 341, 257/342, 343, 329, 330, 331

(56) References Cited

U.S. PATENT DOCUMENTS

| | | | |
|---|---|---|---|
| 4,754,310 | 6/1988 | Coe | 357/13 |
| 5,216,275 | 6/1993 | Chen | 257/493 |
| 5,313,082 | 5/1994 | Eklund | 257/262 |
| 5,438,215 | 8/1995 | Tihanyi | 257/401 |
| 5,646,431 | * 7/1997 | Hsu et al. | 257/342 |
| 6,037,632 | * 3/2000 | Omura et al. | 257/341 |

FOREIGN PATENT DOCUMENTS

| | | | |
|---|---|---|---|
| 4309764 | 9/1994 | (DE) | 257/341 |
| 0114435 | 8/1984 | (EP) | 257/343 |
| 063479 | 1/1995 | (EP) | 257/343 |

OTHER PUBLICATIONS

Japanese Abstract Publication No. 04107867, publication date Sep. 4, 1992, vol. 016, No. 347 (E–12400), Jul. 27, 1992, Matsushita Electron.

* cited by examiner

Primary Examiner—Steven H. Loke
(74) Attorney, Agent, or Firm—Irwin Ostroff; Arthur J. Torsiglieri (57) ABSTRACT

The invention relates to a field effect-controllable semiconductor component of vertical or lateral design i.e. MOSFETs and IGBTs. In this case, depletion zones and complementary depletion zones of opposite conduction types are introduced in the source-drain load path, in the semiconductor body, i.e. in the inner zone in the case of vertical components and in the drift zone in the case of lateral components, the concentration of the regions doped by the first conduction type corresponding approximately to the concentration of the regions doped by the second conduction type.

3 Claims, 7 Drawing Sheets

FIELD EFFECT-CONTROLLED SEMICONDUCTOR COMPONENT

This application is the national phase under 35 U.S.C. §371 of prior PCT International Application No. PCT/DE97/00182 which has an International filing date of Jan. 30, 1997 which designated the United States of America.

FIELD OF THE INVENTION

The invention relates to a field effect-controllable semiconductor component comprising a semiconductor body
  a) having an inner zone of the first conduction type, which adjoins one of the surfaces of the semiconductor body,
  b) having a drain zone, which adjoins the inner zone,
  c) having at least one base zone of the second conduction type, which is embedded in said surface of the semiconductor body,
  d) having at least one source zone of the first conduction type, which is embedded in the base zone,
  e) having at least one source electrode, which in each case makes contact with a base zone and the source zone embedded therein, and
  f) having a gate electrode, which is insulated from the entire semiconductor body.

BACKGROUND OF THE INVENTION

Such vertical field effect-controllable semiconductor components have long been prior art. On the one hand, they are known as VMOS field-effect transistors if the drain zone adjoining the inner zone is of the same conduction type as the inner zone. On the other hand, such field effect-controllable semiconductor components are known as IGBTs if the drain zone is designed as anode zone and is of the opposite conduction type to the inner zone.

Furthermore, the invention also relates to field effect-controllable semiconductor components comprising a semiconductor body of the first conduction type,
  a) having a source zone and a drain zone of the second conduction type, which are spatially separate from one another and are respectively provided with a source electrode and a drain electrode,
  b) having a drift zone of the second conduction type, which lies between the source zone and the drain zone and adjoins the drain zone, and
  c) having a gate electrode, which is insulated from the surface of the semiconductor body and partially covers the source zone and the drift zone.

Such lateral field effect-controllable semiconductor components have been known as lateral MOSFETs for a long time.

The semiconductor components mentioned in the introduction are thoroughly discussed in the book by Jens Peer Stengl; Jenö Tihanti: Leistungs-MOSFET-Praxis [Power MOSFET Practice], 2nd edition, Pflaumverlag, Munich, 1992.

All of the semiconductor components mentioned in the introduction have the inherent disadvantage that the forward resistance $R_{on}$ of the drain-source load path increases as the dielectric strength of the semiconductor component increases, since the thickness of the inner zone or of the drift zone has to increase. In the case of VMOS MOSFETs, the forward resistance $R_{on}$ per unit area is approximately 0.20 ohm/m² at a voltage of 50 V and rises to a value of approximately 10 ohm/m², for example, at a reverse voltage of 1000 V.

In order to eliminate this disadvantage, U.S. Pat. No. 5,216,275 presents a vertical MOSFET in which, instead of a homogeneous, for example epitaxially grown inner zone, layers of the first and of the second conduction type are present alternately. The fundamental structure is shown there in particular in FIGS. 4 and 5 and the associated parts of the description. In particular, the alternating p-type and n-type layers are in that case respectively connected to the base zones and to the drain zones. However, this leads to a severe limitation in the design of a semiconductor component since the edge regions such as the base and drain regions, can no longer be configured freely.

The object of the present invention, therefore, is to develop the field effect-controllable semiconductor components mentioned in the introduction in such a way that, despite a high reverse voltage, a low forward resistance is present and the disadvantages evinced in the prior art are eliminated.

SUMMARY OF THE INVENTION

According to the invention, this object is achieved by means of a vertical power semiconductor component of the type mentioned in the introduction in which one or more depletion zones of the second conduction type and one or more complementary depletion zones of the first conduction type are provided in the inner zone, the total quantity of the doping of the depletion zones corresponding approximately to the total quantity of the doping of the complementary depletion zones.

Furthermore, the object is achieved by means of a field effect-controllable semiconductor component of lateral design in which a multiplicity of depletion zones of the second conduction type are provided in the drift zone, the total quantity of the doping of the drift zone corresponding approximately to the total quantity of the doping of the depletion zones. Moreover, the depletion zones are embedded in the inner zone, free of direct contact to either the base or source zones. It will be convenient to describe such depletion zones as floating within the inner zone.

The invention has the advantage that by simple introduction of depletion zones and complementary depletion zones—preferably paired in the case of V-MOSFETs and IGBTs—, in particular along the current path, on the one hand a good conductivity is ensured by the complementary depletion zones and on the other hand these regions mutually deplete one another in the event of an increase in the drain voltage, as a result of which a high reverse voltage remains secure.

If a reverse voltage is applied to the semiconductor components designed in this way, then a space charge zone forms proceeding from the pn junction between the inner zone and the base zone or zones in the case of the vertical semiconductor components, the extent of which space charge zone grows as the reverse voltage increases. If the space charge zone borders on the depletion zones, then the latter are connected in a high impedance manner to the base zones via the depleted region of the inner zone. If the reverse voltage continues to rise, the space charge zone extends further, with the result that some of the charge carriers from the depletion zones and complementary depletion zones are also depleted. In the event of a further increase in the reverse voltage, the charge carriers are then completely depleted from a large part of the inner zone and from the depletion zones and complementary depletion zones. The space charge zone is thereby shifted in the direction of the drain or anode zone. At maximum applied voltage, the depletion zones and the complementary depletion zones lie completely in the space charge zone. The function of the depletion zones and complementary depletion zones in the lateral MOSFETs is analogous to this.

Since the total quantity of doping in the depletion zones corresponds approximately to the total quantity of doping in the complementary depletion zones, it is ensured that in the event of an increase in the drain voltage, the p–n-type regions formed in this way mutually deplete one another completely, i.e. behave like a single insulator zone, as a result of which a high reverse voltage remains secure.

In one embodiment of the present invention, the depletion zones and the complementary depletion zones are in each case arranged in pairs in the inner zone. Typically, the depletion zones and complementary depletion zones introduced in pairs in the inner zone then have a distance from one another which is greater than or equal to zero and less than or equal to the width of the space charge zone.

In an alternative embodiment of the present invention, there is introduced in the inner zone a single complementary depletion zone in which a multiplicity of depletion zones are introduced, the distance between the depletion zones within the complementary depletion zone then typically being less than or equal to the width of the space charge zone between the depletion zone and the complementary depletion zone.

In this embodiment, the depletion zones introduced in the complementary depletion zone may have an approximately spherical, parallelepipedal or irregular shape.

The complementary depletion zone expediently corresponds to the entire inner zone in a development of this alternative embodiment of the present invention.

Finally, the invention also relates to a method for fabricating depletion zones/complementary depletion zones arranged in pairs. According to the invention, a first epitaxial layer containing p-type dopants and n-type dopants in approximately identical quantities is applied to a substrate, the diffusion coefficients of the two doping elements being distinctly different from one another. Trenches are then etched into the first epitaxial layer and these trenches are filled with a second, high resistivity epitaxial layer. The substrate processed in this way is then subjected to a heat-treatment step during which the two doping elements of the first epitaxial layer, which diffuse at different rates, can diffuse into the second epitaxial layer. Depletion zones and complementary depletion zones are then formed in pairs on the trench edges on account of the different diffusion behavior.

BRIEF DESCRIPTION OF THE DRAWING

The invention is illustrated by way of example in the drawing and described below with reference to the drawing.

In the figures.

DETAILED DESCRIPTION OF THE INVENTION

The semiconductor body of the semiconductor component is designated by 1 in FIGS. 1 to 5. It has a source-side surface 3 and a drain-side surface 16. It has an n⁻-doped inner zone 2, which adjoins the surface 3 of the semiconductor body 1. A plurality of base zones 5 are embedded in the surface 3. These base zones 5 have cell structures. Such cell structures may be in strip form, hexagonal, triangular, round or quadrangular. The base zones 5 have the conduction type which is opposite to that of the inner zone 2, i.e. they are p-doped in the case shown. Two heavily n-doped source zones 6 are in each case embedded in the base zones 5. Contact is made with the base zones 5 and the source zone 6 by source electrodes 7, which are composed of metal, for example aluminum.

Adjoining the other side of the inner zone 2 is a heavily n-doped drain zone 4, or a heavily p-doped anode zone in the case of an IGBT. Said zone is provided with a drain electrode 9 via a metallization layer.

The base zones 5 are spatially separated from one another by means of intercell zones 13.

A gate electrode 8 is arranged above the sourceside surface 3, said gate electrode being insulated from said surface by a gate oxide. The gate electrode 8 may be composed of heavily doped polysilicon or of metal.

Figure 1:
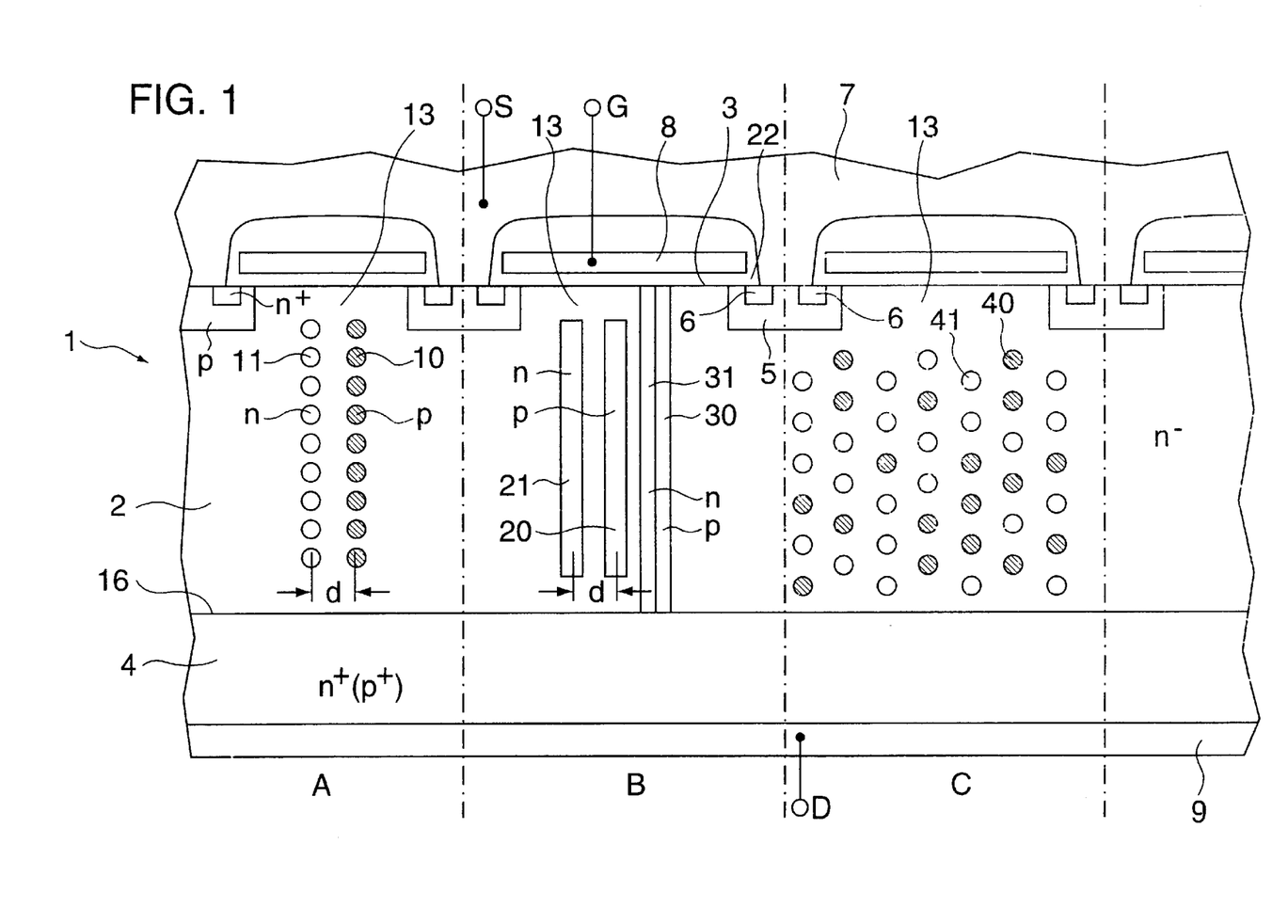
FIG. 1 shows a partial section through a vertical MOSFET according to the invention which—in regions correspondingly indicated by A, B, C—shows various realization options.

FIG. 1 shows various embodiments of the present invention in a single figure, for the sake of clarity.

FIG. 1 shows different depletion zones, complementary depletion zones 10, 11 and 20, 21 and 30, 31 and 40, 41, respectively, introduced in the intercell zones 13 within the inner zone 2. These depletion zones, complementary zones may be in contact with one another, i.e. they may touch one another, but they do not have to touch one another. If they do touch one another, which is the case with the complementary depletion zone 30 and the depletion zone 31 that are shown, they form a pn junction.

All the depletion zones shown are p-doped and all the complementary depletion zones shown are n-doped. As illustrated in the region A by the reference symbols 10, 11, the depletion zones and complementary depletion zones may be of spherical design and extend along the current path and are enclosed within in the inner zone 2 of the drain-source load path. In the region B, the complementary depletion zones 21, 31 and depletion zones 20, 30 are designed such that they are in thread form or in strip form. In that case, the depletion zones 20 are implemented such that they are "floating" within the inner zone 2 and fill only part of the inner zone 2. Alternatively—as indicated by the reference symbols 30, 31, they may extend from the source-side surface 3 down to the drain-side surface 16 and/or right into the drain zone 4. As shown in the region B, the distance d between the depletion zones and complementary depletion zones may be greater than or equal to zero.

A further embodiment, in which random distribution of the depletion zones and complementary depletion zones 40, 41 is provided, is illustrated in the region C. In this case, the shape of the depletion zones and complementary depletion zones 40, 41 and also the doping distribution within the individual depletion zones and/or complementary depletion zones may be irregular. Here again depletion zones 40 and 41 are enclosed within in the inner zone 2.

What is essential to the invention is that the total quantity of the doping of the depletion zones corresponds approximately to the total quantity of the doping of the complementary depletion zones. Furthermore, it must be ensured that the sum of the volumetric expansions of the introduced depletion zones is approximately equal to or less than that of the complementary depletion zones.

Moreover, in the case of the arrangement in accordance with the region C, the average concentration of the distributed depletion zones should be approximately equal to or greater than that of the introduced complementary depletion zones.

The distance d between the individual depletion zones and complementary depletion zones should preferably be less than the width of the space charge zone between the complementary depletion zones and depletion zones at the breakdown voltage between the neighboring depletion zones and complementary depletion zones. The distance d can, however, also become 0, as shown in the region B. In the region A, the distance between the depletion zones (10) should be less than or equal to the width of the space charge zone between the inner zone (2) and the depletion zones (10).

The functioning of the structures shown in FIG. 1 is explained in more detail below.

In the event of a small drain voltage, the conductivity is good since the complementary depletion zones have a low impedance. If the drain voltage is increased, the depletion zones and complementary depletion zones are mutually depleted at a moderate voltage, e.g. a voltage of less than 30 V. In the event of a further voltage increase, the vertical field strength is then increased further and the inner zone 2 takes up the voltage.

In detail, this operation takes place as follows:

The depletion starts from the source-side surface 3 under the gate electrode 8 and source zones 6 embedded in the base zones 5. It then advances into the depletion zones and the complementary depletion zones. When the space charge zone reaches the first depletion zones, these regions remain at the voltage reached by the potential of the space charge zone. The nearest surroundings in the direction of the drain zone 1 are then depleted. This operation is repeated from layer to layer. In this way, the space charge zone advances until the zone underneath the introduced dopings within the inner zone 2 is reached. Overall the space charge zone is then built up as if the additionally introduced depletion zones and complementary depletion zones were not present.

The dielectric strength is in this case determined only by the thickness of the inner zone 2. Consequently, the arrangement according to the invention can fulfill both requirements, namely a low forward resistance $R_{on}$ in conjunction with a high dielectric strength.

Figure 2:
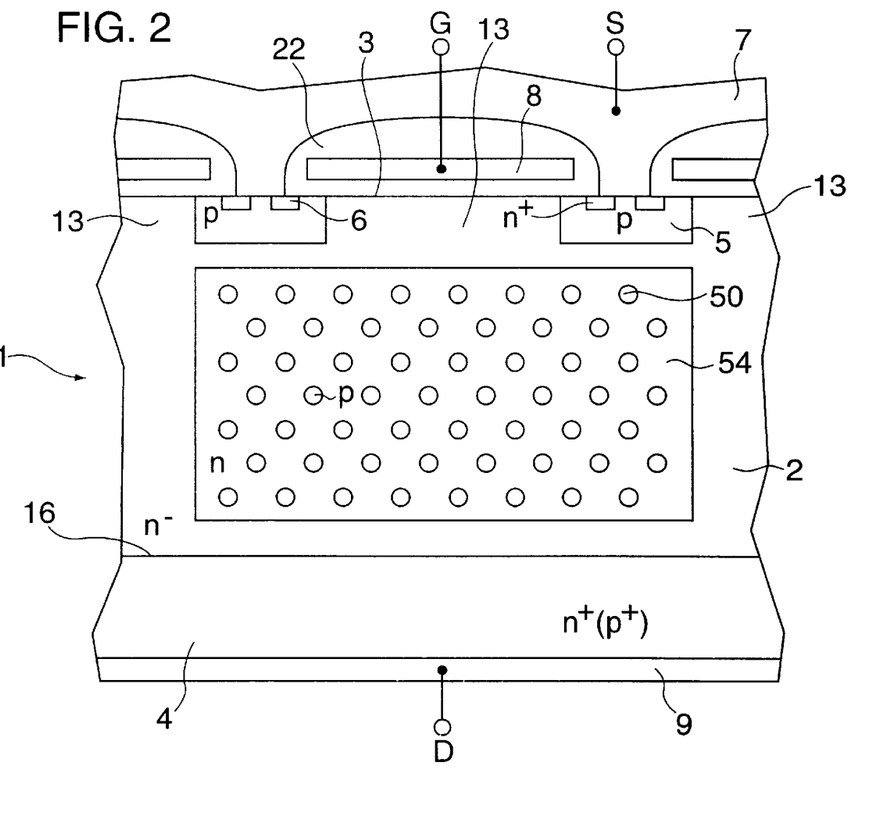
FIG. 2 shows a partial section through an alternative V-MOSFET according to the invention.

FIG. 2 shows an alternative embodiment of the present invention with reference to a V-MOSFET. In that case, an n-doped complementary depletion zone 54 extending from the intercell zones 13 under the base zones 5 is introduced in an n⁻-doped inner zone 2. A multiplicity of p-doped depletion zones 50 are introduced within this complementary depletion zone 54. The distribution of these depletion zones 50 may be random or regular. The depletion zones 50 may have any desired shape, the depletion zones 50 shown in FIG. 2 having an approximately spherical shape. Here, too, the total quantity of the dopings in the distributed depletion zones 50 is approximately equal to the total quantity of the dopings in the n-doped complementary depletion zone 54. Furthermore, the distance between the depletion zones 50 is less than the width of the space charge zone between the depletion zones 50 and the complementary depletion zone 54 at the breakdown voltage between the depletion zones 50 and the complementary depletion zone 54.

Figure 3:
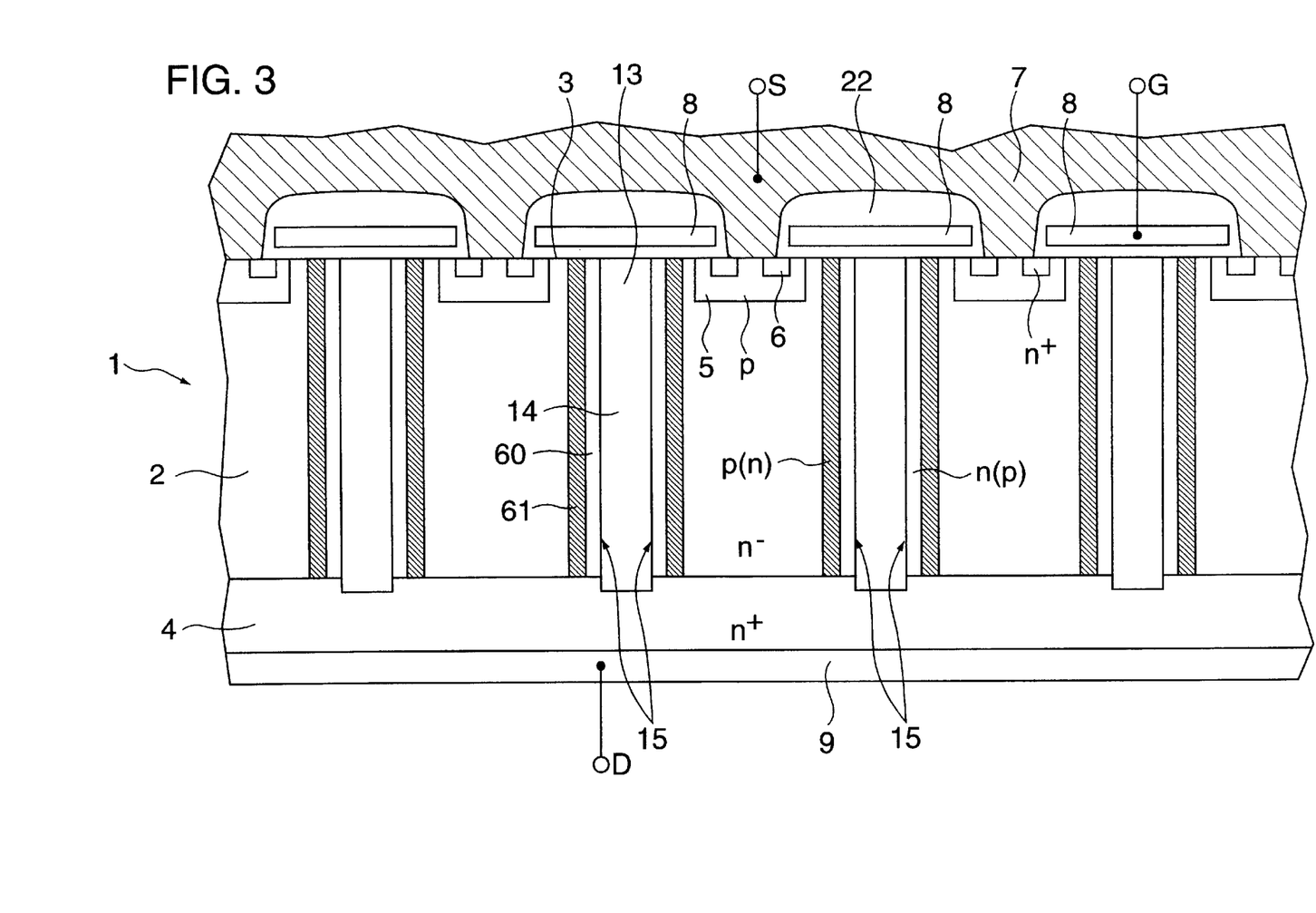
FIG. 3 shows a partial section through a further inventive V-MOSFET having a trench structure.

FIG. 3 shows a further exemplary embodiment of a V-MOSFET according to the invention. This MOSFET differs from those shown in FIGS. 1 and 2 in the configuration of the inner zone 2. In this case, underneath the gate electrodes 8 insulated by gate oxide 22, vertical trenches 14 extend from the source-side surface 3 of the inner zone 2 down into the drain zone 4 in the area of the intercell zones 13. These trenches 14 are partially or completely filled with insulating material, for example silicon oxide and/or weakly doped polysilicon. A combination of a plurality of insulation layers lying one above the other with weakly doped polysilicon lying in between is also possible.

The trenches 14 filled with insulating material in this way are separated from the inner zone 2 by means of an n-doped complementary depletion zone 61, which is provided with a p-doped depletion zone 60. The doping of the trench enclosures produced in this way by the depletion zones 60 and complementary depletion zones 61 is dimensioned such that in the event of a drain voltage which is less than the breakdown voltage between the depletion zones 60 and complementary depletion zones 61, the depletion zone 60 and the complementary depletion zone 61 are virtually completely depleted.

The cross section of the trenches 14 may be round, in strip form or as desired. In this case, the trenches 14 do not have to extend right into the drain zone 4, rather the depth profile is freely selectable. If a round trench cross section is chosen, for example, then the depletion zones 60 and complementary depletion zones 61 enclosing the trench 14 filled with insulating material acquire a quasi cylindrical shape.

The order of the doping of the depletion zones 60 and complementary depletion zones 61 between the inner zone 2 and the trench 14 is arbitrary, i.e. the complementary depletion zone 60 can be arranged either between trench 14 and complementary depletion zone 61 or between complementary depletion zone 61 and inner zone 2.

Furthermore, it is also possible for only part of the trench walls 15 to be occupied by depletion zones 60 and complementary depletion zones 61.

Figure 4:
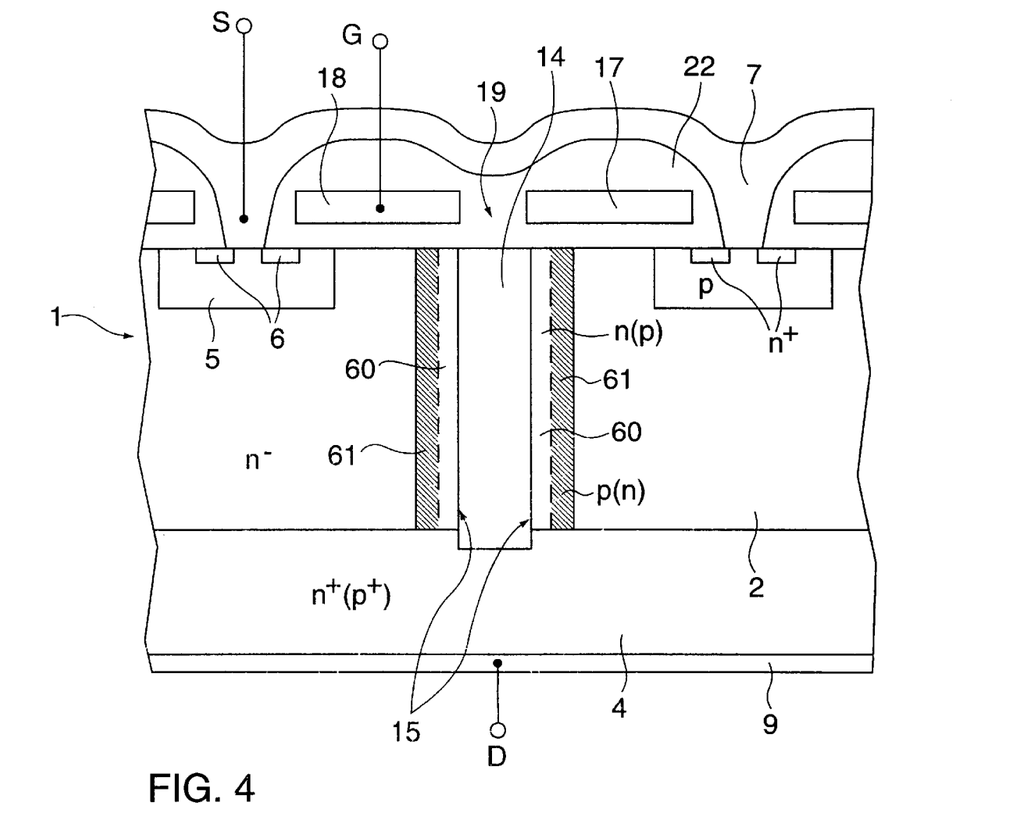
FIG. 4 shows a partial section through a further inventive V-MOSFET having a trench structure.

FIG. 4 shows a further exemplary embodiment corresponding to the arrangement illustrated in FIG. 3. The difference with respect to the arrangement according to FIG. 3 consists in the configuration of the gate electrode. In contrast to the arrangement illustrated in FIG. 3, here the gate electrode is divided into two, or that is to say has a gate cutout 19 which splits the gate electrode into a first subregion 17 and a second subregion 18. The purpose of this arrangement is that a gate electrode designed in this way masks the trench 14 located beneath it. The method for fabricating the trench 14 can thereby be simplified. As in the case of known structures in which the gate is used to mask specific regions during the fabrication method, the shape of the gate in this case means that the formation of the trench 14 is set in accordance with the shaping of the gate cutout 19.

Figure 5:
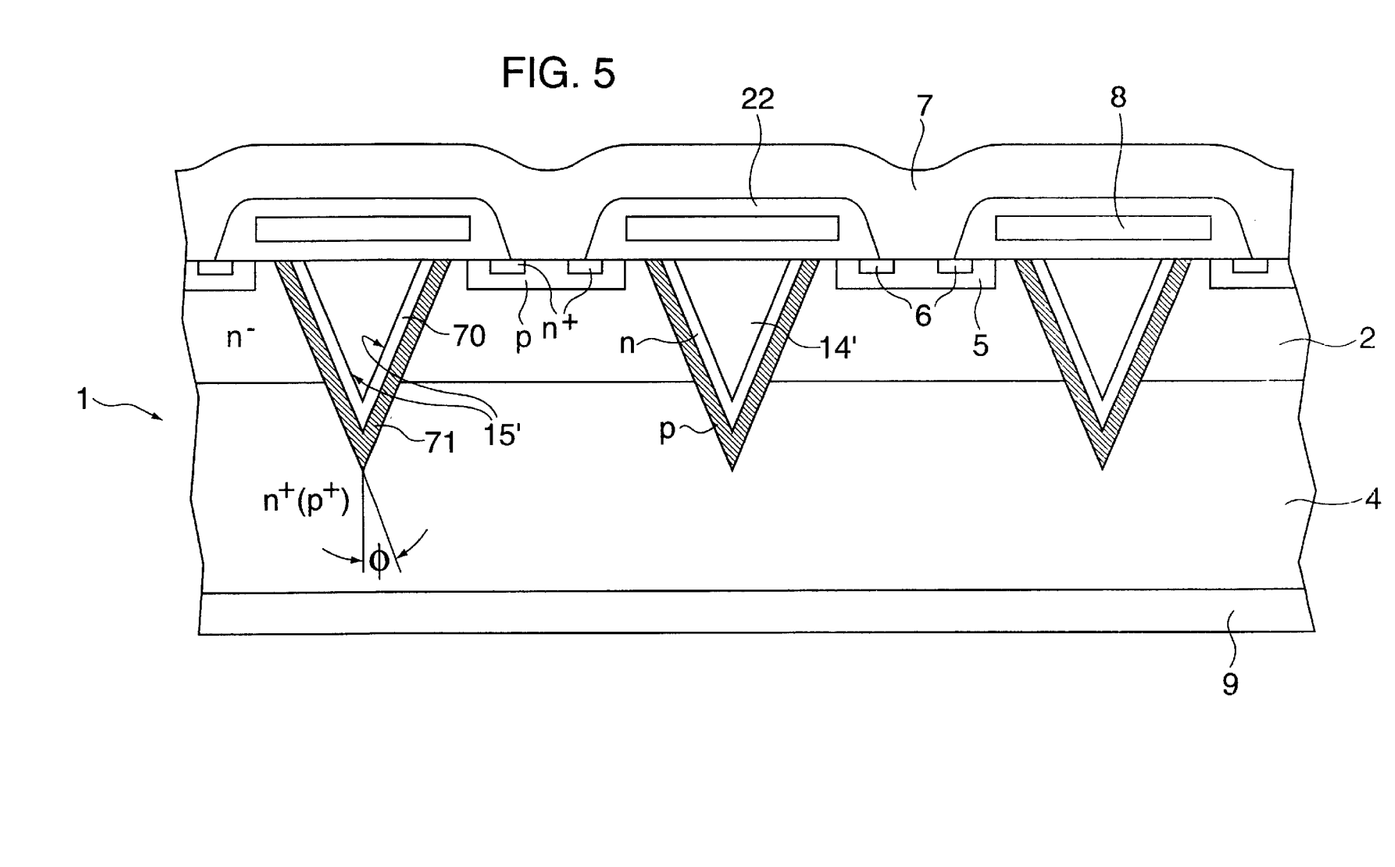
FIG. 5 shows a partial section through an inventive V-MOSFET having a V-shaped trench structure.

FIG. 5 shows a further exemplary embodiment of a vertical MOSFET. The V-MOSFET shown here likewise corresponds essentially to the structure represented in FIG. 3, with the difference that the trench 14' is in this case designed as an approximately V-shaped trench. Accordingly, the depletion zones and complementary depletion zones also are of V-shaped design. Equally, however, it is also conceivable to design the vertex or turning point of the trench 14' such that it is U-shaped. Such a trench V-MOSFET is easy to fabricate if the trenches are of V-shaped design, as illustrated in FIG. 5, a very small angle Φ, preferably 5° to 10°, being used. The trench walls 15' can then be occupied with high accuracy and uniformity by ion implantation with an angle of incidence of 0°. The different dopings of the depletion zones and complementary depletion zones can be driven into the monocrystalline silicon of the drain zone 4 and of the inner zone 2 from the trench wall by means of one or more high-temperature treatments. Here, too, it is conceivable for in each case only one trench side wall to be occupied by a depletion zone and/or a complementary depletion zone.

Figure 6:
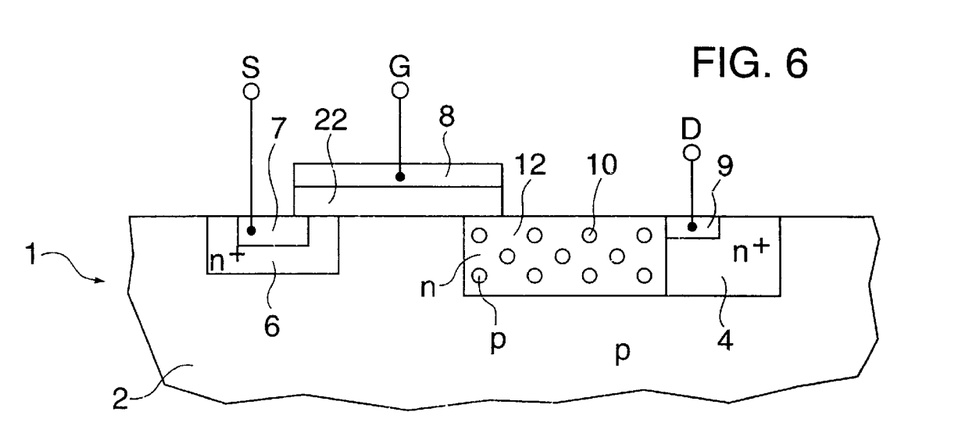
FIG. 6 shows a partial section through a lateral MOSFET according to the invention, FIGS. 7a to 7d each show partial sections which are used to show the characteristic method steps for fabricating a vertical MOSFET according to the invention, FIGS. 8a to 8c each show partial sections which are used to show alternative method steps for fabricating a vertical MOSFET according to the invention.

FIG. 6 shows a further exemplary embodiment, which illustrates a lateral MOSFET. As is evident from FIG. 6, the lateral MOSFET comprises a semiconductor body 1 having a p-doped inner zone 2. An n-doped source zone 6 is introduced in the p-doped inner zone 2, on the surface 3 thereof. A source electrode 7 made of metal silicide, which is connected to a source terminal S, is situated in the n-doped source zone 6. Furthermore, a likewise n-doped drain zone 4 is introduced in the surface 3 of the semiconductor body 1. The n-doped drain zone 4 again has a drain electrode 9 made of metal silicide which has a drain terminal D. A weakly n-doped drift zone 12 is situated between source zone 6 and drain zone 4. p-Doped depletion zones 10 are again introduced in this drift zone 12. The distance between—the individual p-doped depletion zones 10 is preferably again less than the width of the space charge zone between the introduced p-doped depletion zones 10 and the weakly n-doped drift zone 12. Here, too, the total quantity of the dopings in the distributed p-doped depletion zones 10 is approximately equal to the total quantity of the dopings in the weakly n-doped drift zone 12.

A gate electrode 8 is situated above the semiconductor body in a known manner, said gate electrode being insulated from the entire semiconductor body 1 by means of a gate oxide 22. The gate electrode 8 can also be configured in a known manner in such a way that the distance between the gate electrode 8 and the p-doped inner zone 2 increases from the source zone 6 in the direction of the drain zone 4.

The functioning of such a lateral structure according to the invention is explained in more detail below. In the event of a small drain voltage, the conductivity is good since the n-doped drift zone 12 has a low impedance. If the drain voltage is moderately increased, then the depletion zones 10 and the drift zone 12 mutually deplete one another. In the event of a further voltage increase, the lateral field strength is then increased in such a way that the entire bulk of the drift zone 12 is depleted. That region of the inner zone 2 which lies between the drift zone 12 and the source zone 6 then takes up the further voltage.

FIGS. 7a to 7d show a possible method for fabricating a vertical semiconductor component according to the present invention. A first thin n⁻-doped layer 92 is grown epitaxially on an n⁺-doped substrate 94. Said layer is doped with alternating n-doped and p-doped regions 95, 96, for example by means of corresponding masking and ion implantation. Of course, the doping can also be carried out using other known methods.

Figure 7A:
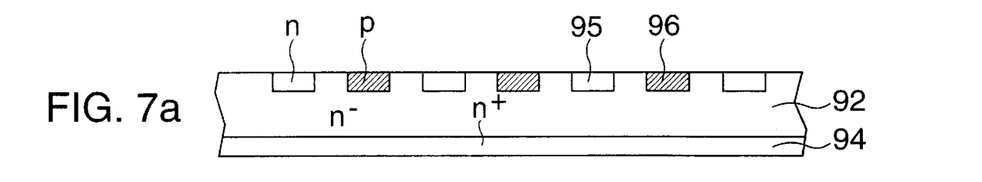
Figure 7B:
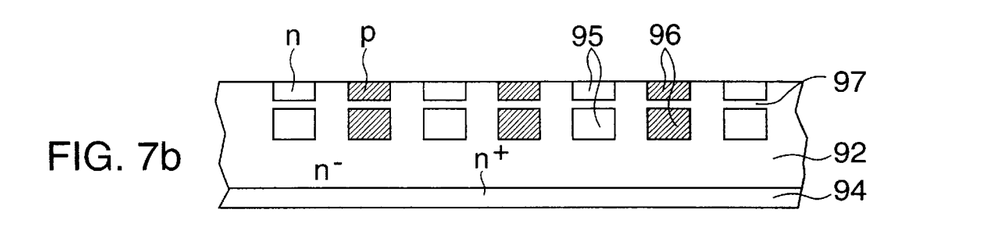

Afterwards, as can be seen in FIG. 7b, a further n⁻-doped layer 97 is applied by epitaxy. By repeating this step, the n⁻-doped zone 92 is finally completed, except for the base zones 98 still to be introduced, by means of multistage epitaxial deposition.

Figure 7C:
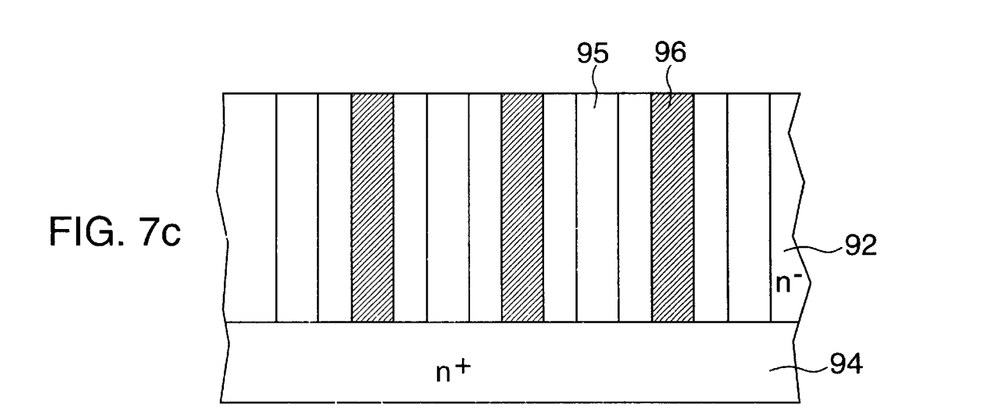

Depending on the masks used, a wide variety of structures can be formed for each layer. The dopings of the depletion zones 96 and complementary depletion zones 95 can be selected for example in such a way that after a high-temperature treatment, the individual depletion zones 95 and complementary depletion zones 96 of one layer are joined to those of the underlying layer, with the overall result, as illustrated in FIG. 7c, that depletion zones 95 in strip form and complementary depletion zones 96 in strip form are produced. However, the depletion zones 95 and complementary depletion zones 96 which are doped in the individual layers can also be separate from one another, as is illustrated in regions A and C in FIG. 1. In addition, ran-dom spatial distributions of the individual regions can be achieved by corresponding selection of the masks.

Figure 7D:
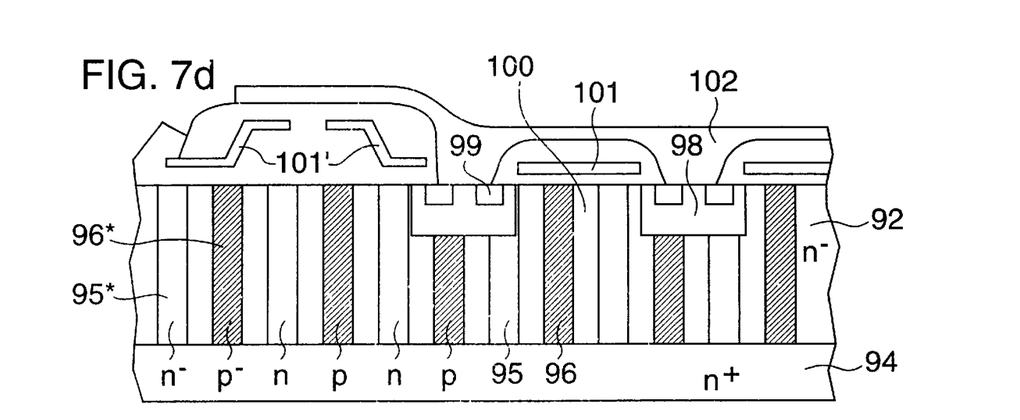

Finally, the base zones 98 and the source zones 99 are introduced in a further applied epitaxial layer and, in the remaining regions, a further doping of depletion zones and complementary depletion zones may be effected, for example, with the result that the depletion zones 95 and complementary depletion zones 96 in strip form extend in the intercell zones 100 up to the surface.

The depletion zones and complementary depletion zones introduced at the edge region in FIG. 7d are designated by 95' and 96'. These marginal depletion zones 95' and complementary depletion zones 96' are preferably doped more weakly than the other depletion zones 95 and complementary depletion zones 96 situated in the inner part of the semiconductor body. Further steps for applying the gate electrode 101 and the edge gate electrode 101', respectively, and the source electrode 102 then follow in a known manner.

Figure 8A:
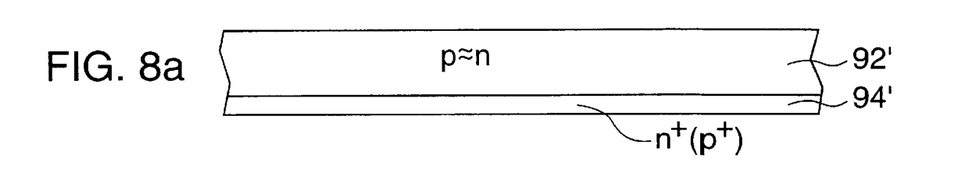
Figure 8B:
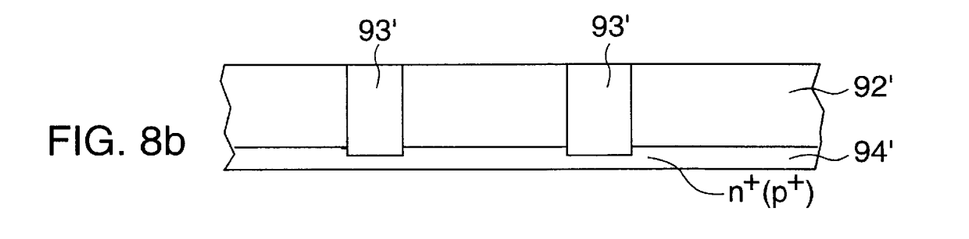
Figure 8C:
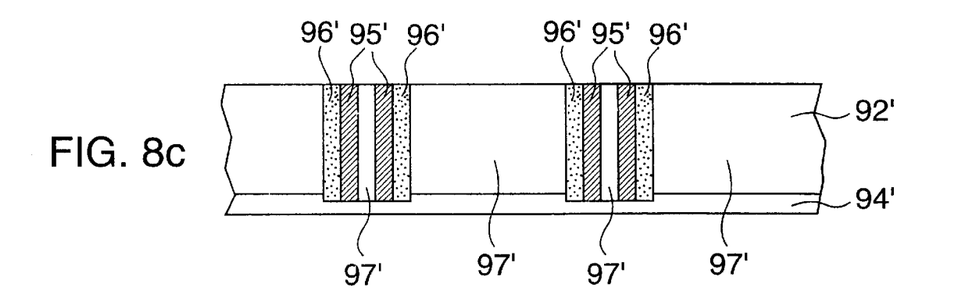

FIGS. 8a to 8c show a further improved method for fabricating a vertical field effect-controllable semiconductor component according to the present invention. In that case, the introduction of the depletion zones 95' and complementary depletion zones 96' occurs via the indirect route of a first special epitaxially deposited layer. A first epitaxial layer 92', which simultaneously contains p-type dopants and n-type dopants in approximately identical quantities, is applied to a substrate 94'. In this case, the dopants are selected such that the diffusion coefficients of the two doping elements are distinctly different from one another. Boron is particularly suitable as p-type dopant and arsenic as n-type dopant, since the diffusion coefficient of arsenic is about 10 times greater than that of boron.

Afterwards, trenches 93' in the desired geometric dimensions are etched into this first epitaxial layer 92', extremely good reproducibility not being a matter of importance in this step.

Afterwards, the trenches 93' are filled with a second, high-impedance epitaxial layer 97', this second epitaxial layer 97' filling the trench in such a way that no crystal defects occur at all. This is illustrated in FIG. 8b.

Finally, the semiconductor body processed in this way is then subjected to a temperature step during which the two elements of the first epitaxial layer 92', which diffuse at different rates, in other words e.g. the dopants arsenic and boron, can diffuse into the second epitaxial layer 97'. On account of the different diffusion coefficient, the dopant that diffuses better, boron in the present example, accumulates in the second epitaxial layer 97', while the dopant that diffuses less well, arsenic in the present example, is predominant in the first epitaxial layer 92' at the edge to the trench.

After this heat-treatment step, which can also be combined with the succeeding steps of the fabrication process for the semiconductor component to be produced, a depletion layer 95' and a complementary depletion layer 96' are present in each case at the edge of the trench. The total quantity of p-doping and n-doping is thus always approximately identical since the originally introduced doping is now distributed differently as a result of the process described. Accordingly, the process is virtually self-aligning.

The introduction of the base zones and source zones and also the application of the gate electrode and the formation of the edge regions take place analogously to the method which has been described above.

The methods shown in FIGS. 7 and 8 can easily be modified for the fabrication of lateral MOSFETs.

To summarize, it may be stated that both vertical and lateral MOSFETs and IGBTs having a low forward resistance $R_{on}$ in conjunction with a high reverse voltage can be provided by the present invention. What is essential is the formation of p-doped and n-doped regions in pairs, which are structured or randomly introduced, regions in strip form preferably being provided, which are formed along the current path of the load path. The present invention can be applied both to p-channel MOSFETs and to n-channel MOSFETs or else to corresponding IGBTs.

List of reference symbols

1=Semiconductor body
2=Inner zone
3=Source-side surface
4=Drain zone
5=Base zone
6=Source zone
7=Source electrode
8=Gate electrode
9=Drain electrode
10=Depletion zone
11=Complementary depletion zone
12=Drift zone
13=Intercell zone
14=Trench
15=Trench wall
16=Drain-side surface
17=Gate cutout
18=First gate region
19=Second gate region
20,30,40,50,60,70=Depletion zone
21,31,41,51,61,71=Complementary depletion zone
22=Gate oxide
92=First n⁻-type epitaxial layer
92'=First epitaxial layer
93=Trench
94=n⁺-type substrate
94'=Substrate
95=p-doped region=depletion zone
95'=Depletion layer
95\*=Edge depletion zone
96=n-doped region=complementary depletion zone
96'=Complementary depletion layer
96\*=Edge complementary depletion zone
97=Second n⁻-type epitaxial layer
97'=Second epitaxial layer
98=base zone
99=source zone
100=intercell zone
101=gate electrode
101'=marginal gate electrode
102=source electrode

What is claimed is:

1. Field effect-controlled semiconductor component comprising a semiconductor body with a top surface having:

a) an inner zone of the first conduction type that adjoins the top surface of the semiconductor body;

b) a drain zone that adjoins the inner zone;

c) at least one base zone of the second conduction type that is embedded in the top surface of the semiconductor body;

d) at least one source zone of the first conduction type embedded in the base zone;

e) at least one source electrode that in each case makes contact with the base zone and the source zone embedded therein;

f) a gate electrode that is insulated from the semiconductor body;

g) a multiplicity of depletion zones of the second conduction type and one or more complementary depletion zones of the first conduction type are embedded in the inner zone, the depletion zones floating in the inner zone, the total amount of impurity dopant in the depletion zones being approximately equal to the total amount of impurity dopant in the complementary depletion zones; and characterized in that (h) trenches extend from the top surface into the inner zone in the intercell zones, the trenches being filled with insulator and being provided on their trench walls with depletion zones and complementary depletion zones arranged in pairs.

2. The semiconductor component as claimed in claim 1, characterized in that the trenches are of approximately V-shaped design.

3. The semiconductor component as claimed in claim 1, characterized in that the trenches are of approximately U-shaped design.

* * * * *